United States Patent [19]

Yang

[11] Patent Number: 6,091,743
[45] Date of Patent: Jul. 18, 2000

[54] BANDWIDTH BROADENED AND POWER ENHANCED LOW COHERENCE FIBEROPTIC LIGHT SOURCE

[75] Inventor: Dan Dan Yang, Gatineau, Canada

[73] Assignee: AFC Technologies Inc., Hull, Canada

[21] Appl. No.: 09/026,654

[22] Filed: Feb. 20, 1998

[51] Int. Cl.[7] ...................................................... H01S 3/30
[52] U.S. Cl. .................................. 372/6; 372/19; 359/339
[58] Field of Search .......................... 372/6, 19; 359/339

[56] References Cited

U.S. PATENT DOCUMENTS

| | | | |
|---|---|---|---|
| 5,177,634 | 1/1993 | Way | 359/339 |
| 5,808,788 | 9/1998 | Park et al. | 359/339 |
| 5,818,630 | 10/1998 | Fermann et al. | 372/19 |

*Primary Examiner*—Rodney Bovernick
*Assistant Examiner*—Robert E. Wise
*Attorney, Agent, or Firm*—Pascal & Associates

[57] ABSTRACT

An optical light source signal generator comprising an optical amplification medium for generating amplified spontaneous emission (ASE), having forward and backward light propagating ports for outputting output and backward optical light respectively, a reflector for reflecting the backward propagating optical light back toward the backward light propagating port, and an optical light spectrum reshaper interposed between the reflector and the backward light propagating port for transmitting the reflected light to the backward light propagating port with a wavelength dependence having a reduced amplitude in a band coinciding with an undesired high gain band of the optical amplification medium.

13 Claims, 5 Drawing Sheets

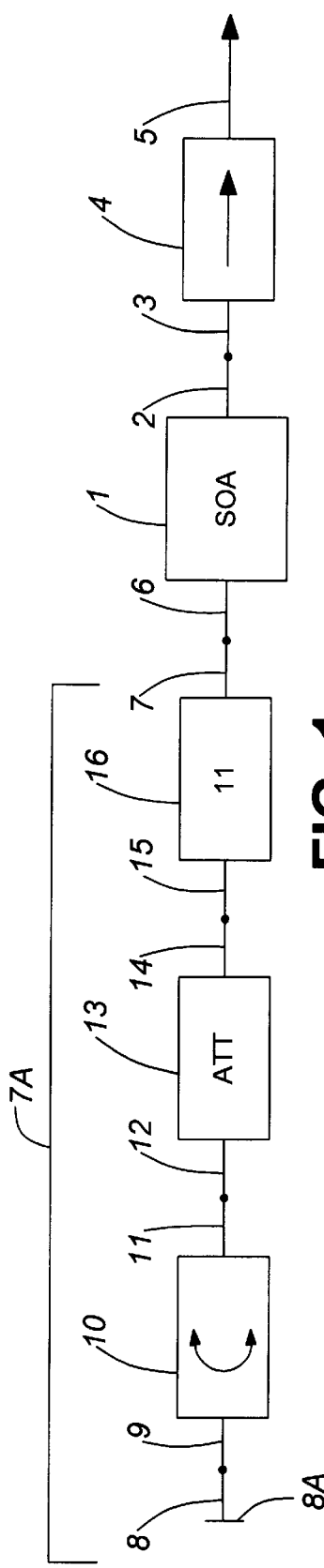
FIG. 1
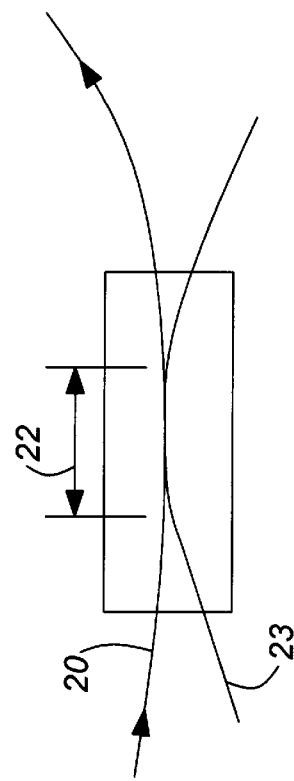
FIG. 2A
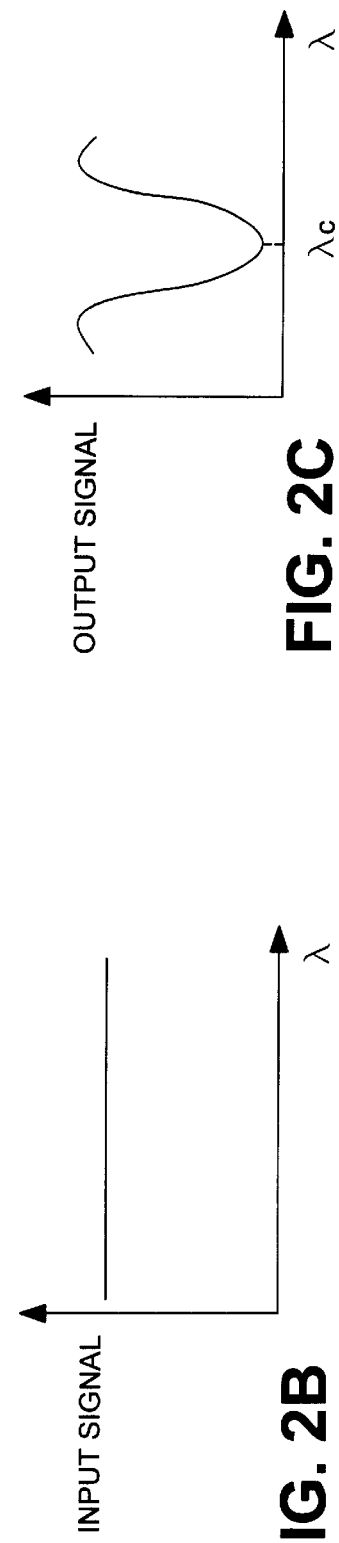
FIG. 2B
FIG. 2C

BANDWIDTH BROADENED AND POWER ENHANCED LOW COHERENCE FIBEROPTIC LIGHT SOURCE

FIELD OF THE INVENTION

This invention relates to the field of optical light sources, and in particular to an optical low coherence light source having broad spectrum width and emitting single transverse mode light of which the intensity is typically a few thousand time stronger than regular light emitting diodes (LEDs).

BACKGROUND TO THE INVENTION

Low coherence broadband optical sources are required for optical imaging and optical sensors. Such sources are used for example in coherence domain optical tomography, some medical diagnostic technology such as Doppler velocimeters, remote sensors for detecting temperature, pressure, strain, etc., low coherence light source based fiber optic gyroscopes, fiber optic instrumentation, etc.

Such applications have very high optical light source spectrum width and shape requirements as well as power density of the main optical emitter or lighting device. For example, in optical imaging, the imaging resolution, defined by $RES=f(\lambda)*1/\Delta\lambda$, $\Delta\lambda$ being the spectral width and $f(\lambda)$ a function depending on source wavelength, changes with the optical source bandwidth. Thus when the source spectrum is broader, the resolution is greater and more detail can be seen by the imaging system. In an optical sensor application, a greater optical emitter bandwidth means more sensors can be included in a single sensing system sharing the same optical source, and the whole sensor system cost can be lower since fewer optical emitters can be used.

The power level of the source is also of concern, since the sensor system loss budget can be greater with a higher power optical source. Total power of the source determines the imaging or sensor system loss that can be tolerated. Loss is caused by the high light scattering nature of the human tissue into which the light caused to penetrate. Higher power represents deeper penetration of the light into the tissue under diagnosis.

More importantly, the power of the source determines the imaging speed, which determines whether the source can be used to do in-vivo disease detection in hospitals and clinics.

In the case of fiber optic temperature or strain sensing, hard to reach regions where sensors (such as fiber Bragg grating based sensors) are introduced can introduce large losses, either due to long light transmission distances or due to fiber bending. Higher emitter power can increase the sensitivity of the sensor.

The spectrum shape of the light source is also important, particularly for optical imaging systems in which a quasi-Gaussian spectrum shape is required for clean and sharp image quality.

SUMMARY OF THE INVENTION

The present invention provides a low cost power and bandwidth enhanced low-coherence optical light source which is suitable for the above applications.

A spectrum broadened and power enhanced fiber optic light source can be fabricated from an active optical amplification medium such as rare earth doped fiber or a semiconductor optical amplifier. The output power is greatly enhanced and the spectrum widely broadened after feeding back a reshaped and optionally polarization scrambled backward propagating amplified spontaneous emission originating from the amplification medium itself.

In accordance with an embodiment of the invention, an optical light source signal generator comprises (a) an optical amplification medium for generating amplified spontaneous emission (ASE), having forward and backward light propagating ports for outputting output and backward optical light respectively, (b) a reflector for reflecting the backward propagating optical light back toward the backward light propagating port, and (c) an optical light spectrum reshaper interposed between the reflector and the backward light propagating port for transmitting the reflected light to the backward light propagating port with a wavelength dependence having a reduced amplitude in a band coinciding with an undesired high gain band of the optical amplification medium.

In accordance with another embodiment, a method of generating a low-coherence optical light, comprises generating, in an ASE light generator, output and backward emitted optical amplified spontaneous emission (ASE) light, passing the backward emitted optical light through an optical light spectrum reshaper and feeding back spectrum reshaped light to the light generator for modifying the low coherence optical light source in accordance with the spectrum reshaped light, so as to obtain modified spectrum output light.

Preferably the spectrum reshaper decreases the amplitude of the light to be fed back in a band in which the light generator has undesirably high gain.

In accordance with another embodiment, the light which is fed back is polarization scrambled, which when fed back does not cause lasing of the ASE light generator.

BRIEF DESCRIPTION OF THE DRAWINGS

A better understanding of the invention will be obtained by a consideration of the detailed description below, in conjunction with the following drawings, in which:

FIG. 1 is a block diagram of an embodiment of the invention,

FIG. 2A is a schematic diagram of a filter formed of an optical fiber coupler,

FIG. 2B is a diagram of an example spectrum of input light to the filter of FIG. 2A, FIG. 2C is a diagram of an example spectrum of output light from the filter of FIG. 2A.

DETAILED DESCRIPTION OF EMBODIMENTS OF THE INVENTION

Figure 3A:
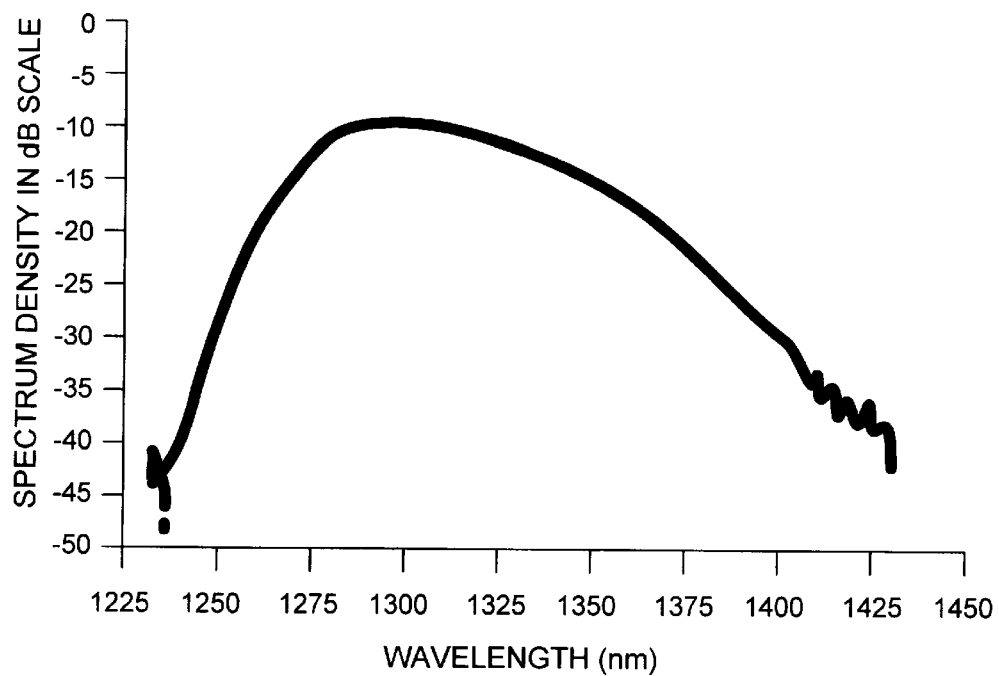
FIG. 3A is a diagram of a natural amplified spontaneous emission spectrum.

As shown in FIG. 1, a semiconductor optical amplifier 1 is an example of an amplification medium used in this embodiment. The amplifier has two output ports, one being an output port 2 and another being a backward propagating port 6. The output port 2 is fusion spliced to the input 3 of a single or double stage polarization independent optical isolator 4. The output 5 of the isolator is the output of the entire device. The purpose of the isolator 4 is to avoid perturbation of the back reflection after output, and therefore this element can be deleted if other means are taken to avoid this perturbation.

The backward propagating port 6 is fusion spliced to the input 7 of a control loop 7A. In this embodiment, a single arm control loop is shown, although a multi-arm control loop can be used, as will be described later.

The loop 7A is comprised of a reflector 8A formed of a gold-covered tip of an optical fiber carrying the optical signal. The fiber pigtail 8 which ends in the reflector 8A is fusion spliced to the input 9 of an optional Faraday polarization rotator 10. The rotator output 11 is fusion spliced to the input 12 of an optional attenuator 13. The attenuator output arm 14 is fusion spliced to a reshaping filter 16 via input 15. The filter output 7 is also the control loop 7A output, which is fusion spliced to the amplifier 1 backward light propagating port.

As will be noted later, the Faraday polarazation rotator 10 and attenuator 13 are optional devices, and are used depending on whether fed back light power exceeds the optical amplifier lasing threshold. The polarization rotator, attenuator and reshaping filter are all bidirectional devices, i.e. their inputs can also be their outputs. If used, the order of these devices can be changed, and by adjusting the attenuation, the desired result can be achieved.

In operation, the optical amplification medium 1 forms a fluorescent light emitting material. The optical amplification medium can for example be a doped fiber amplifier (DFA), or a semiconductor based optical amplifier (SOA). Amplified spontaneous emission (ASE) is generated via an energy transfer either optically or electronically. ASE which is generated propagates in two directions: one forward propagating (i.e. in the same direction as the signal when it is used as an amplifier), and the other is backward propagating (i.e. propagating in the reverse direction as compared to the usual propagation direction). The forward propagating light is emitted at port 2 and the backward propagating light is emitted at port 6.

In this invention, the DFA or SOA is used both as a seed light generator and as a light emitter. The backward propagating ASE is used to generate seed light in a passive fiber optic control loop 7A. The control loop reshapes the spectrum and sends the light back to the amplification medium 1 via the backward light propagating port 6.

The control loop 7A spectrum shapes and rebalances the light fed back to the amplification medium, with a notch, or reduced amplitude within a band, which can be centered to the amplifier 1 gain peak or ASE peak, although the reduced amplitude band can be located over any useful region. With this modified light amplified, the output of the amplifier is spectrum reshaped. Due to the strong seed signal, the amplifier functions in saturation and outputs a strong and broad spectrum with a desired shape.

In one successful embodiment, the gain peak was at approximately 1320 nm, and the filter was centered as 1290 nm.

It is preferred to use the above-described structure rather than an active light emitting device such as a super luminescent diode together with a wavelength dependent filter and/or attenuator, because the latter structure involves high cost and system complexity. The present invention as described above provides a completely passive, easy to configure and low cost control loop 7A. However, an active emitter such as a superluminescent diode (SLD) can replace the passive reflector and the rotator and attenuator, as long as the bandwidth of the SLD broad enough to provide sufficient seed signal (spectral width and intensity).

The reshaping element 11 is preferably a wavelength dependent attenuator (filter). The filter can be formed of a thin film based device, or a fiber grating device. However, thin film based devices are very costly and are difficult to manufacture. Fiber grating devices (such as Bragg grating and long period grating) are prone to instabilities with temperature change and introduce spectral ripples, and at this time are difficult to design to provide the desired bandwidth and filter shape.

It is preferred that a fused optical coupler should be used, such as is shown in FIG. 2A. The coupler is formed of an optical fiber 20 which has its cladding fused at a narrowed coupling region 22 to the cladding of another optical fiber 23.

Fiber 20 carries the optical signal between ports 7 and 15. Fiber 23 has short stubs on either side of the coupling region 22. Fiber 23 absorbs some of the light content with a wavelength dependence such that the remaining light transmitted by fiber 20 has a notch or a decrease in amplitude in its spectrum, which is centered with the amplification gain curve of the optical amplifier. This can be seen in FIG. 2B which illustrates the amplitude of a representative input signal with respect to wavelength to the coupler via optical fiber 20, and in FIG. 2C which illustrates the amplitude of a representative output signal with respect to wavelength from the coupler via optical fiber 20.

It is well known that optical amplifiers are only one step from forming a laser. An optical amplifier placed in a cavity consisting of reflective mirrors will emit coherent laser light. However, for low-coherence source applications, as in the present invention, the coherence length of the light is required to be minimized.

In the light generator configuration as described herein, the backward propagating ASE fed back to the amplifier is in phase with the forward propagating ASE. If the feedback exceeds the lasing threshold, laser effects occur and the source coherence length is increased. Therefore, the amount of light that can be fed back is limited to being below the lasing threshold.

Because the optical amplifier output power depends strongly on the amount of the input seed light up to deep saturation, in order to be able to send as strong as possible light back to the amplifier without lasing, a polarization scrambler or rotator 10 can be used. This element can be for example a Lyot depolarizer, or a Faraday rotator. Either, or other devices which achieve polarization scrambling or rotation can be used to increase the lasing threshold sufficiently to avoid lasing effects.

The reflector 8A at the end of the fiber 8 can be a well known gold reflective coating on a smoothed tip of the fiber. Alternatively, a bi-directional fused coupler with a defined coupling ratio can be used in its place, its two output arms fusion spliced together, as described in U.S. patent application Ser. No. 08/914,163 and is incorporated herein by reference. For the purposes of this specification, both of the above, a SLD as described above, or any device which returns light applied to it should be construed as being a reflector can be used.

Figure 3B:
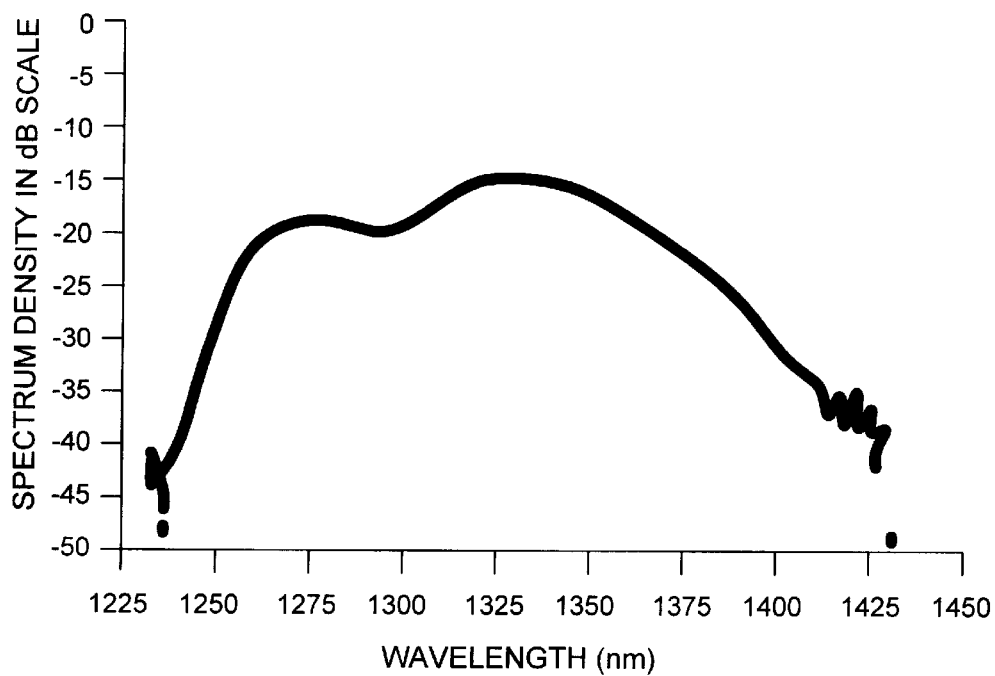
FIG. 3B is a diagram of the seed signal spectrum after filtering.

FIG. 3A illustrates an example of an ASE spectrum generated by the optical amplifier, backward ASE being used to generate the filtered seed light. FIG. 3B illustrates an example of the seed light spectrum after filtering. Depending on the desired spectrum shape and final output level, as well as optical amplifier characteristics, the filter width, depth and center wavelength can be adjusted. As may be seen in FIG. 3A, the 5 dB down points of the ASE signal are at about 1270 and 1350 nm, while those of the signal spectrum after filtering are at about 1260 and 1372 nm.

Figure 4A:
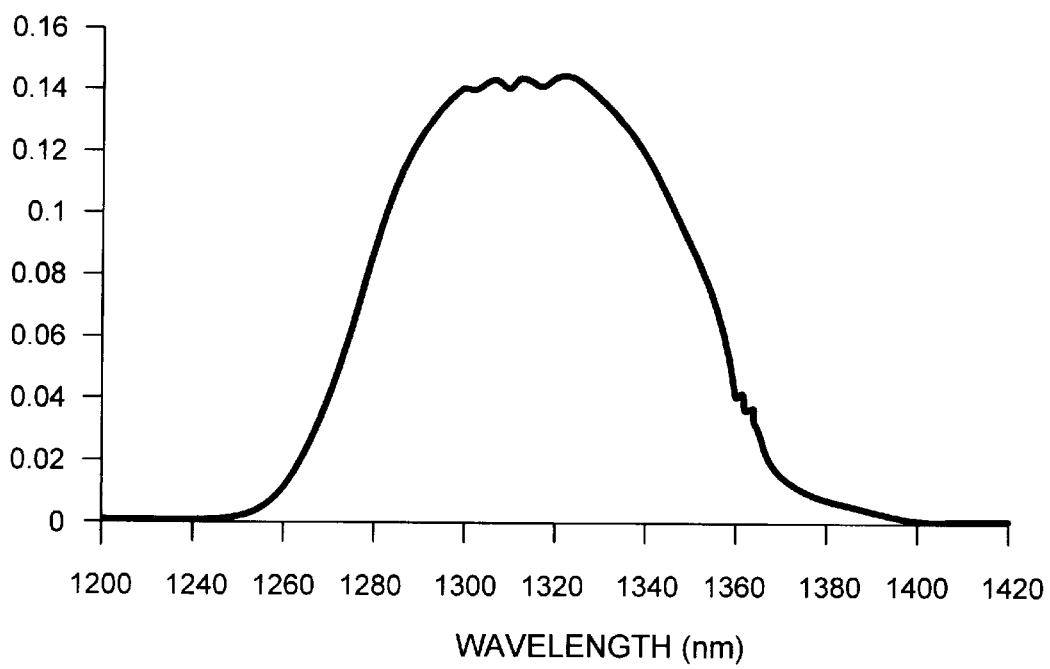
FIG. 4A is the final output spectrum of the signal generator of the present invention plotted on a linear scale.
Figure 4B:
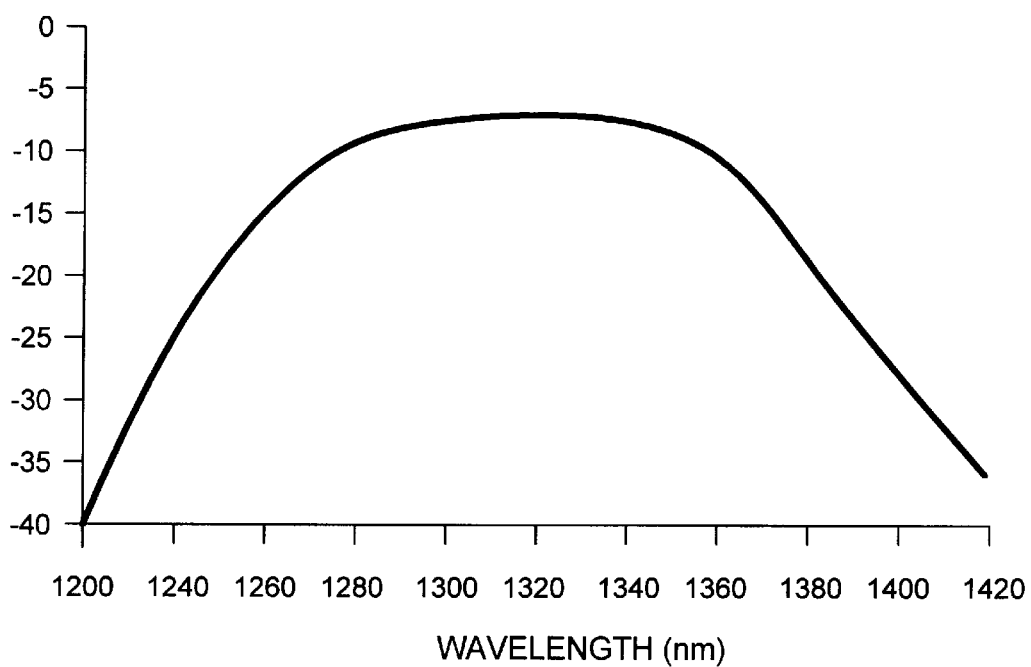
FIG. 4B is the final output spectrum of the signal generator of the present invention plotted on a logarithmic scale.

FIG. 4A is the final output spectrum of the signal generator of an embodiment of the present invention plotted on a linear scale, and FIG. 4B is the final output spectrum of the signal generator of that embodiment of the present invention plotted on a logarithmic scale. Smoothness, relative constancy over the high amplitude portion of the spectrum as well as the increased bandwidth over the original naturally generated light is evident.

Figure 5:
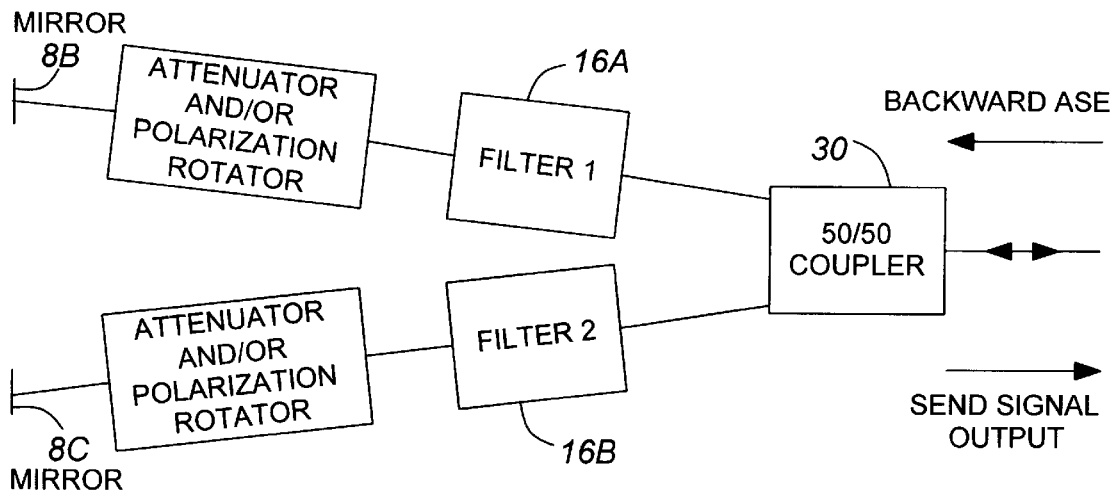
FIG. 5 is a block diagram of another embodiment of the invention, and FIGS. 6 and 7 respectively illustrate imaging and sensor systems which utilize the novel broadband source described herein.

While the description above relates to a single arm seed light generator, FIG. 5 illustrates a multiple arm (in this case a double arm) structure. Each of the arms is comprised of a filter 16A, 16B, which are spliced to a 50/50 (or other ratio) coupler 30. The coupler is also spliced to the backward light propagating port of the amplifier 1 (not shown in FIG. 5.

The other ports of filters 16A and 16B are coupled to reflectors 8B and 8C, which as described earlier can be mirrors formed by the gold coatings at the tips of the fibers which carry the optical signals, or which can be formed by the couplers or other devices described above and in the aforenoted U.S. patent application.

Optionally, one or more of an attenuator and polarization rotator is coupled in series with the filter and mirror in each arm, as described above with respect to the single arm structure, and which operates in a similar manner and for the same reason, i.e. to raise the lasing threshold of the amplifier.

Each of the filters can have its own frequency response, to reduce the amplitude of a portion of the light to be fed back to the amplifier, in order to flatten the overall output signal from the optical signal generator. Indeed, the decreased amplitude bands can overlap, and one band can completely envelop the other.

Figure 6:
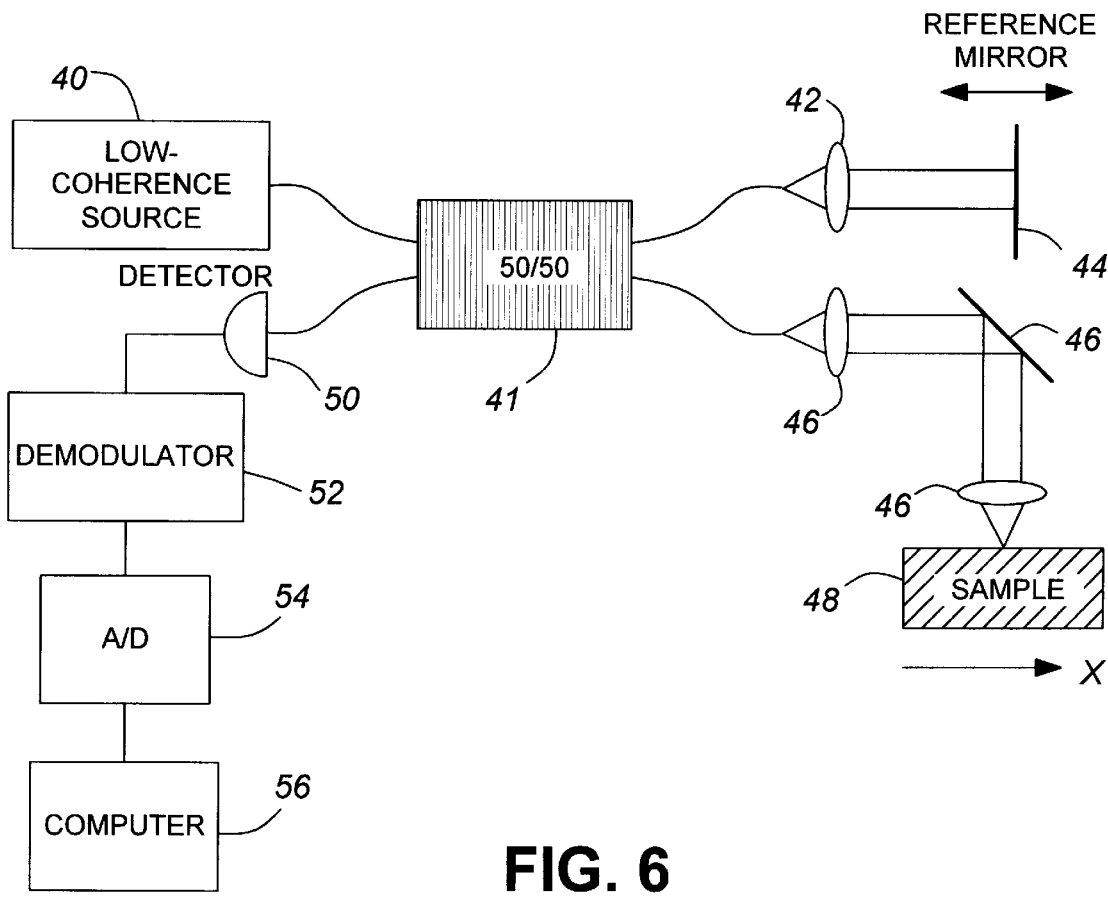

The low coherence source can be used for high speed imaging in a system as shown in FIG. 6. A low coherence source 40 such as that described herein provides optical light to a 50/50 coupler 41. One of the ports of the coupler is fed via optics 42 to a reference mirror 44. Another of the ports is coupled via scanning optics 46 to a sample 48. The remaining port if the coupler is coupled to a detector 50, the output signal of which is demodulated in demodulator 52. The demodulated signal is converted to digital in analog to digital converter 54, from which it is fed to the input of a computer 56 for analysis.

The structure provides low coherence interferometry in the coupler 41 between the scanned sample signal and the signal reflected in the reference mirror, which is analyzed in computer 56.

By the use of the present invention in such an imaging system, that system can be used for the first time in real diagnostics on live people, because the present invention allows imaging at a speed of a few tens of images per second (e.g. 32 images per second). Using prior art light sources such as LEDs or SLDs, one image required several seconds. Since live human tissue or cells is constantly in motion, the prior art light sources would allow imaging only of dead (still) bodies.

Figure 7:
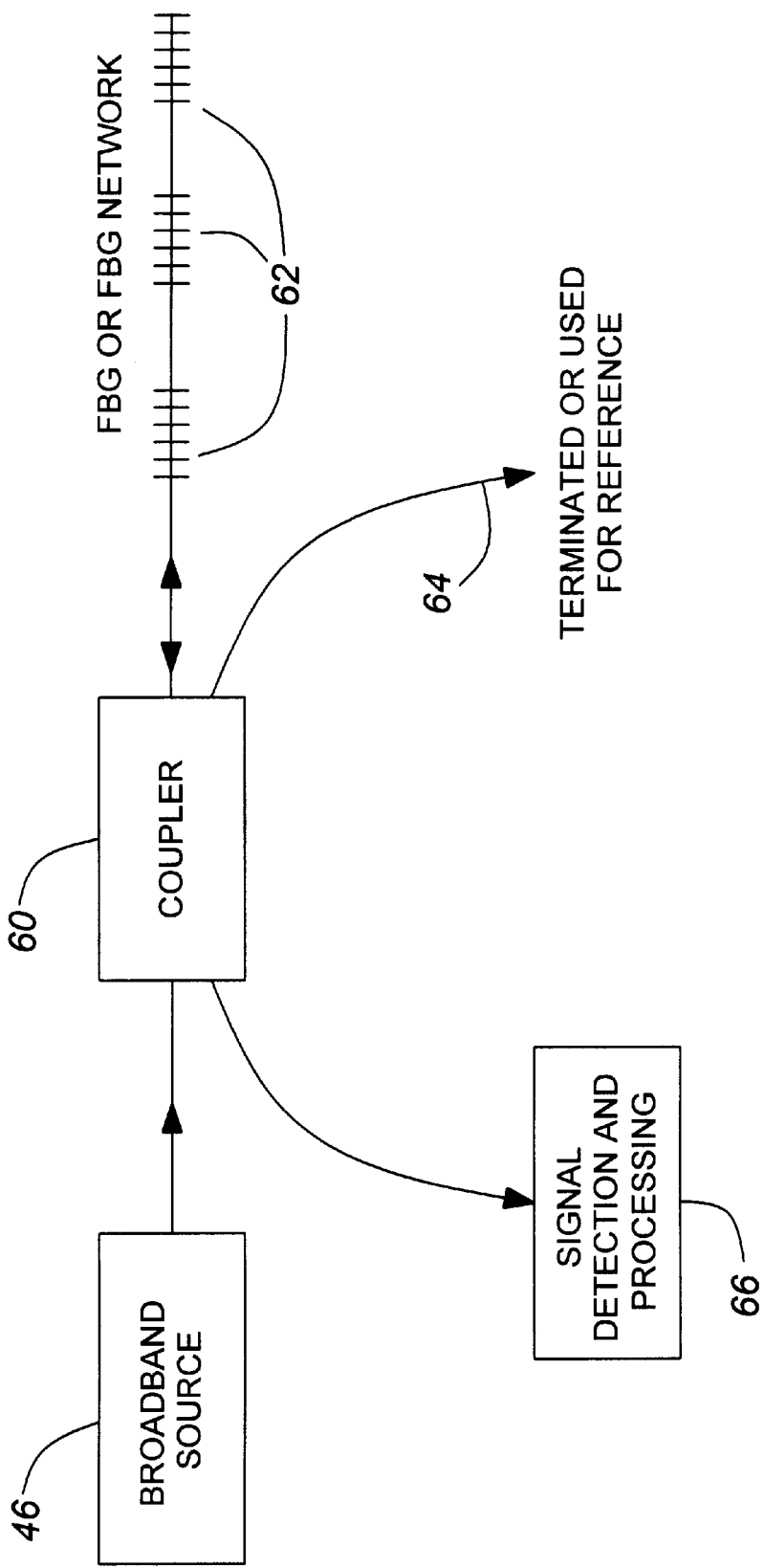

FIG. 7 illustrates a block diagram for using the broadband source described above in a fiber temperature or strain sensor system. The source 46 is coupled to an optical coupler 60. The fiber carrying the input light is coupled to a fiber Bragg grating or network 62. The other (coupled) fiber has one end 64 terminated, or is used for a reference, and its other end coupled to a light detection and processing system 66.

The light generated by source 46 and reflected by the gratings 62 is coupled to the other fiber by coupler 60, and is processed by the signal detection and processing system 66.

The present invention allows e.g. 16–32 sensors to share a single source, while prior art LED or SLD light sources each could drive a single sensor, with one elctronic driver for each diode. The present invention thus reduces the cost of sensor applications substantially.

A person understanding this invention may now conceive of alternate embodiments and enhancements using the principles described herein. All such embodiments and enhancements are considered to be within the spirit and scope of this invention as defined in the claims appended hereto.

I claim:

1. An optical light source signal generator comprising:
   (a) an optical amplification medium for generating amplified spontaneous emission (ASE), having forward and backward light propagating ports for outputting output and backward optical light respectively,
   (b) a reflector for reflecting the backward propagating optical light back toward the backward light propagating port, and
   (c) an optical light spectrum reshaper interposed between the reflector and the backward light propagating port for transmitting the reflected light to the backward light propagating port with a wavelength dependence having a reduced amplitude in a band coinciding with an undesired high gain band of the optical amplification medium.

2. A generator as defined in claim 1 in which the optical light spectrum reshaper is comprised of a filter formed of one of a thin film deposit device, a filter grating device, and a fused optical coupler.

3. A generator as defined in claim 2 further including at least one of a light polarization scrambling or rotating element and an optical attenuator coupled in series with the reshaper.

4. A generator as defined in claim 1 in which the optical light spectrum reshaper is comprised of a filter formed of a fused optical coupler comprised of a pair of optical fibers having fused claddings in a coupling region, one of the optical fibers having an end coupled to the backward light propagating port and another end coupled to the reflector, the other of the optical fibers being formed as short stubs on opposite sides of the coupler, and absorbing light in said band from said one of the optical fibers.

5. A generator as defined in claim 4 further including at least one of a light polarization scrambling or rotating element and an optical attenuator coupled in series with the reshaper.

6. A generator as defined in claim 5, in which the reflector is a gold coated planar end to said one of the optical fibers, forming a mirror.

7. A generator as defined in claim 4, in which the reflector is a gold coated planar end to said one of the optical fibers, forming a mirror.

8. A generator as defined in claim 1, further including a first coupler having one bidirectional output port coupled to the reshaper and having a bidirectional input port coupled to the backward light propagating port, and a second light spectrum reshaper coupled between another bidirectional output port of the first coupler and a second reflector for transmitting a second reflected signal to the backward light propagating port via the first coupler with a wavelength dependence having a reduced amplitude in a second band coinciding with a second high gain band of the optical amplification medium.

9. A generator as defined in claim 8 in which each of the optical signal spectrum reshapers is comprised of a filter formed of a fused optical coupler comprised of a pair of optical fibers having fused claddings, one of the optical fibers of each fused optical coupler having an end coupled via the first coupler to the backward light propagating port and another end coupled to a corresponding reflector, the other of the optical fibers of the respective fused optical couplers being formed as short stubs on opposite sides thereof and absorbing light in a respective band from a corresponding one of said one of the optical fibers.

10. A generator as defined in claim 9 further including at least one of a polarizing scrambling or rotating element and an optical attenuator connected in series with a corresponding optical signal reshaper.

11. A method of generating a low-coherence optical light, comprising generating, in an ASE light generator, output and backward emitted optical amplified spontaneous emission (ASE) light, passing the backward emitted optical light through an optical light spectrum reshaper and feeding back spectrum reshaped light to the light generator for modifying the low coherence optical light source in accordance with the spectrum reshaped light, so as to obtain modified spectrum output light.

12. A method as defined in claim 11 including decreasing the amplitude of the light to be fed back in a band in which the signal generator has undesirably high gain.

13. A method as defined in claim 12, including polarization scrambling or rotating the light to be fed back.

* * * * *